(12) United States Patent
Stanley

(10) Patent No.: US 6,504,348 B2
(45) Date of Patent: Jan. 7, 2003

(54) REMOTE SENSING BY HIGH-ORDER FILTERING

(75) Inventor: Gerald R. Stanley, Osceola, IN (US)

(73) Assignee: Harman International Industries, Incorporated, Northridge, CA (US)

( * ) Notice: Subject to any disclaimer, the term of this patent is extended or adjusted under 35 U.S.C. 154(b) by 0 days.

(21) Appl. No.: 09/751,044

(22) Filed: Dec. 29, 2000

(65) Prior Publication Data

US 2001/0030529 A1 Oct. 18, 2001

Related U.S. Application Data

(60) Provisional application No. 60/174,302, filed on Jan. 3, 2000.

(51) Int. Cl.[7] .............................. G05F 1/40; H02M 3/24
(52) U.S. Cl. ........................................ 323/280; 363/98
(58) Field of Search ................................ 323/200, 282, 323/284, 285; 330/107, 109, 110, 10; 363/41, 98

(56) References Cited

U.S. PATENT DOCUMENTS

| 4,001,524 A | * | 1/1977 | Prudhon et al. ......... 179/170 T |
| 4,276,587 A | | 6/1981 | Koizumi |
| 5,115,386 A | | 5/1992 | Shirahama et al. |
| 5,352,986 A | * | 10/1994 | Modgil et al. ................ 330/10 |
| 6,196,371 B1 | * | 3/2001 | Martin et al. ............... 195/317 |

OTHER PUBLICATIONS

Pbullcation, "A Practical Method of Designing RC Active Filters", R.P. Sallen and E.L. Key, (Reprinted from IRE Trans Circuit Theory, vol. CT–2, pp. 74–85, Mar. 1955), pp. 51–62.

* cited by examiner

Primary Examiner—Rajnikant B. Patel

(57) ABSTRACT

A power converter having a remote sensing system. The power converter includes a high-pass feedback signal, a remote sensing low-pass signal, a constant-sum filter combining the high-pass feedback signal and the remote sensing low-pass signal. The constant-sum filter is at least a second order filter and generates an error signal. The constant-sum filter is a three terminal low-pass filter and an input terminal, an output terminal, and a common terminal. The input terminal receives the remote sensing low-pass signal. The common terminal receives the high-pass feedback signal. The output terminal transmits the feedback control signal.

26 Claims, 3 Drawing Sheets

PWM AMPLIFIER WITH HIGH-ORDER REMOTE SENSING FEEDBACK

2nd ORDER 3-TERM LP FILTERS

PWM AMPLIFIER WITH HIGH-ORDER REMOTE SENSING FEEDBACK

REMOTE SENSING BY HIGH-ORDER FILTERING

BACKGROUND OF THE INVENTION

1. Field of the Invention

The present invention generally relates to the regulation of power converters and more particularly to the regulation of amplifiers using remote sensing to control the signal at the amplifier load.

2. Description of the Related Art

It is often desired to improve the regulation of a voltage source at its load by sensing and controlling the actual voltage produced at the load. Such remote sensing, as it is called, overcomes limitations of finite source impedance which derives from the impedance of connecting cables, connectors, filters, etc., that lie between a signal source and a load. In the simplest of situations, one would derive all controlling feedback from the voltage induced across the load.

In practice, this does not allow for a wide bandwidth closed-loop system, as the impedances between the source and the load form a low-pass filter which adds phase lag to the feedback and thus does not improve the closed-loop stability of the system.

This filter/stability problem may be addressed by deriving the high-frequency feedback signal local to the signal source and remotely deriving the low-frequency feedback signal at the load.

A simple circuit is shown in FIG. 1 which automatically aligns the high and low-pass characteristics of the system. This approach may be used on DC-to-DC power supplies and AC power/signal sources as well. Conventional AC line voltage generators use remote sensing to improve the accuracy of the voltage delivered to the load (i.e., the device under power).

Some audio amplifiers use remote sensing to achieve very high damping factors at their output terminals by eliminating the internal impedance added by internal filters and termination impedances. In the latter case, where an accurate frequency response is required, it is possible to correct a small response error created by the output loading of the remote sensing network R1,C1 by adding R2,C2 to the input network as shown in FIG. 1.

Switch-mode amplifiers have output filters which create a significant output impedance and phase shift. If all feedback is taken at the output of the filter, very little high frequency voltage feedback will be possible, especially if the load is an arbitrary impedance. If all voltage feedback is taken at the input to the filter, on the other hand, the feedback signal will include large amounts of pulse width modulation (PWM) ripple which will create distortion if introduced into the control loop. A filter having large attenuation in the frequency bands corresponding to the frequency of the switching ripple is required to reject the PWM spectra. Similar issues are associated with current feedback signals.

The local or high-pass portion of the voltage feedback may be designed to use either the ripple attenuating properties of the output filter or to augment that filter with its own ripple reducing attributes. A continuum of solutions is possible where some or none of the output filter is used for the local high-pass portion of the feedback. If none of the output filter is used, then maximum stability margins can be obtained as the load impedance changes. Any load regulation improvement that occurs in such a system must come through the low-pass feedback path. It is desirable to use the highest cross-over frequency possible to maximize the output regulation.

The performance of this system can be jeopardized when the series impedance between the actual signal source and the load acts as a high-Q inductance and the load contains a high-Q shunt capacitance. The series resonant network formed by this common configuration results in a large peak gain at the resonant frequency which can easily equal or exceed the attenuation of the low-pass filter formed for the load feedback. Instability may result when the gain margin of the feedback loop is overwhelmed by the gain peak of this resonance. This condition is common to both switch-mode amplifiers and AC line voltage sources. A switch-mode amplifier used as a gradient amplifier has a resonance form with the inductance of its output filter and the added capacitance of electromagnetic interference (EMI) filters on the gradient cables. A line voltage generator must power electronic power supplies with large input filters. In both cases, the Q of the inductances must be high or conduction losses will be severe. Also, the Q of the capacitances is often high to allow maximum EMI filtering.

If the circuit of FIG. 1 is used, the cross-over frequency between the load and local feedback must be set to a lower frequency than ideal, reducing the load regulation bandwidth. What is needed is more attenuation of the high frequencies fed back from the load without a serious reduction in feedback at frequencies well below resonance.

SUMMARY OF THE INVENTION

The present invention provides an amplifier having a remote sensing system using a high-order filter to combine a remote sensing low-pass signal and a local high-pass feedback signal. The amplifier includes a high-pass feedback signal, a remote sensing low-pass signal, and a constant-sum filter combining the high-pass feedback signal and the remote sensing low-pass signal. The constant-sum filter is at least a second order filter and generates the voltage feedback control signal. In one embodiment of the invention, the constant-sum filter is a three-terminal, low-pass filter with unity gain having an input terminal, an output terminal, and a common terminal. The input terminal receives the remote sensing low-pass signal. The common terminal receives the high-pass feedback signal. The output terminal transmits the feedback signal.

BRIEF DESCRIPTION OF THE DRAWINGS

The above-mentioned and other features of this invention, and the manner of attaining them, will become more apparent and the invention itself will be better understood by reference to the following description of embodiments of the invention taken in conjunction with the accompanying drawings, wherein.

DESCRIPTION OF THE EMBODIMENTS OF THE INVENTION

The embodiments disclosed below are not intended to be exhaustive or limit the invention to the precise forms disclosed in the following detailed description. Rather, the embodiments are chosen and described so that others skilled in the art may utilize their teachings.

Figure 3:
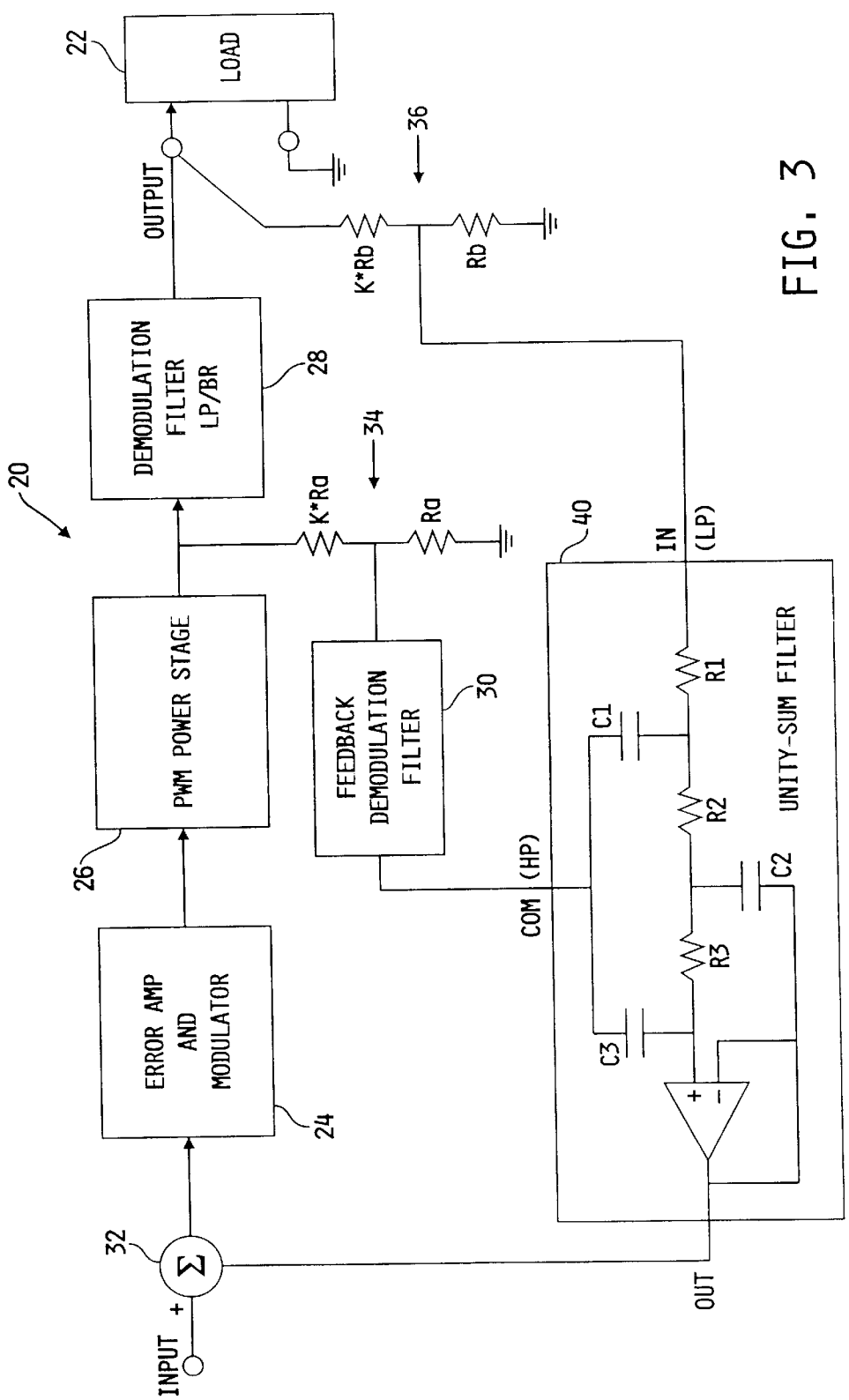
FIG. 3 is a schematic view of a pulse width modulated amplifier with remote sensing in accordance with the present invention.

Referring now to FIG. 3, an amplifier in accordance with the present invention and generally referenced as 20, is shown connected to a load 22. Amplifier 20 includes an error amplifier and modulator 24, a pulse width modulation (PWM) power stage 26, a demodulation filter 28, a feedback demodulation filter 30, and voltage dividers 34, 36.

Amplifier 20 is an opposed current amplifier with a low-pass feedback signal and a high-pass feedback signal combined at high-order filter 40 as further described below. Amplifier 20 actively filters the low-pass feedback signal with demodulation filter 28 and the high-pass feedback signal with demodulation feedback filter 30.

Demodulation filter 28, which is a low-pass filter combined with attenuator 36, has broad-band attenuation to the pass-band sufficient to prevent voltage overload or clipping in high-order filter 40 when amplifier 20 is outputting high voltages. Such attenuation is created with precision resistors according to principles known in the art. Voltage divider 36 follows filter 28 and reduces the voltage of the low-pass feedback signal provided to high-order filter 40.

Demodulation feedback filter 30 is designed according to principles known in the art to attenuate PWM ripple spectra generated by PWM power stage 26 with attenuator 34 and provide broad-band attenuation to the pass-band sufficient to prevent voltage overload or clipping in filter 40 when amplifier 20 is outputting high voltages. Voltage divider 34 reduces the voltage of the input to feedback demodulation filter 30. The effective resistance in the input of filter 30 is typically equal to the output resistance of voltage divider 34 which precedes filter 30.

Figure 1:
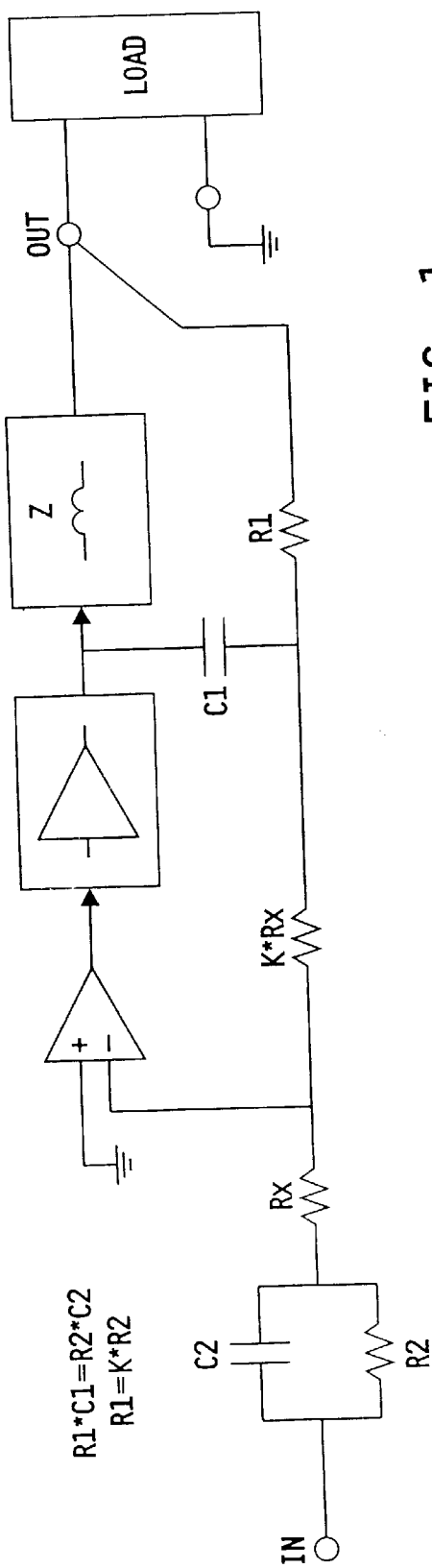
FIG. 1 is a schematic view of a prior art remote sensing circuit.

In the embodiment shown in FIG. 3, high-order filter 40 is a third order Sallen and Key type filter and outputs a feedback signal to summer 32. The cut-off frequency of filter 40 is chosen to be below the lowest resonance frequency that would be expected to result from an external capacitive load being in resonance with the internal filter inductor (see FIG. 1). There is no limit to the order of filter 40 that can be used in this circuit other than what cost and complexity will allow. Therefore, it is possible to manage the gain margin deficiencies that can result from any high-Q resonance in demodulation filter 28.

If the net feedback to summer 32 without load 22 is to result in a flat response near the cross-over frequency of high-order filter 40, then the sum of the low and high frequency feedback signals must be constant. In practice, the most easily derived constant value for a constant-sum result is unity, i.e. unity-sum. Accordingly, in FIG. 1, the two feedback paths are using a unity-sum cross-over network to effect their band-limited purposes. Such an approach assures that corrections to the source signal are not made unless there is a loss of regulation at the load to warrant such response adjustments. While a non-unity-sum approach is possible, it would necessitate response corrections to account for the induced errors. Ideally, a system with an implicit unity-sum nature is used since it also eliminates any inverse equalization tolerance issues that could result from manufacturing or from drift of component characteristics over time.

For any cross-over network to be unity sum, the rational polynomials that represent the low frequency and high frequency responses, by definition, sum to unity. This can only occur if the numerator $N(s)$ is equal to the denominator $D(s)$. This also implies that the unfactored denominator of both responses be equal to $D(s)$. Since this is true, the numerator can be represented by two parts, the numerator of the low-pass filter, $N1(s)$, and the numerator of the high-pass filter, $N2(s)$, with $N1(s)+N2(s)=N(s)=D(s)$.

It can be shown that the low-pass and high-pass responses cannot both have cutoff characteristic rates of the order of $D(s)$ near the cross-over frequency without also having severe peaks in their passband response approaching the cross-over frequency. It is possible, however, for one of the responses to have a nearly flat passband and have a rate of cutoff approaching the order of $D(s)$ near the cross-over frequency if the other response has a low rate of cutoff and is dominated by a single pole near the cross-over frequency. In remote sensing applications, this is not a problem, since only the low-pass response used by the load sensing path needs a high rate of cutoff. The high-pass response used by the local feedback can be dominated by a single pole response and give acceptable results.

Figure 2:
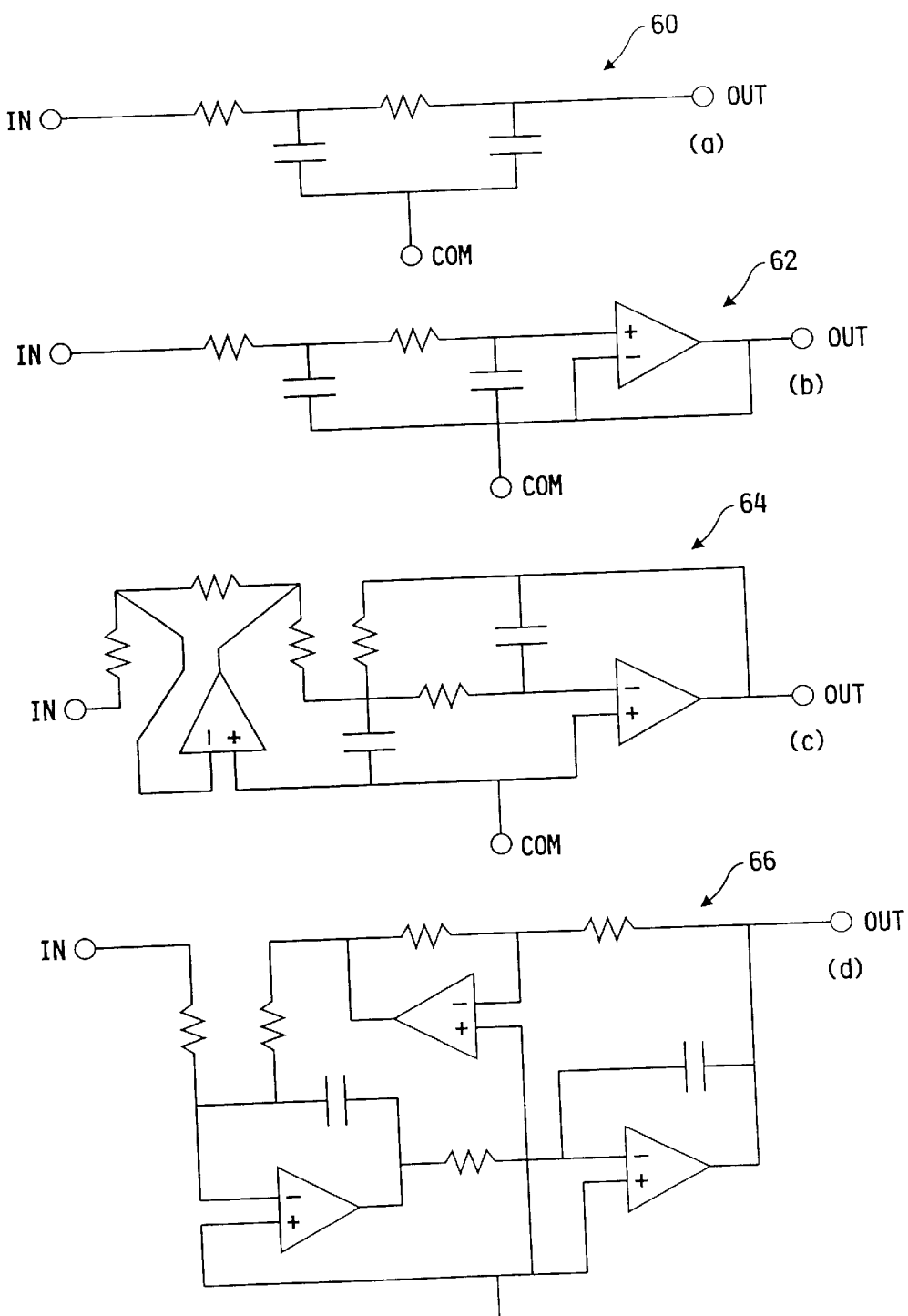
FIG. 2(a) is a schematic view of a passive low-pass filter for use in a remote sensing circuit according to the present invention.
FIG. 2(b) is a schematic view of a Sallen and Key low-pass filter for use in a remote sensing circuit according to the present invention.
FIG. 2(c) is a schematic view of a multiple feedback low-pass filter for use in a remote sensing circuit according to the present invention.
FIG. 2(d) is a schematic view of a state variable low-pass filter for use in a remote sensing circuit according to the present invention.

Various filter topologies can be employed to form unity sum responses according to the teachings of the present invention. Any classic three-terminal low-pass filter of unity DC gain (passive or active) can readily be converted into a unity-sum filter if the common of the filter is connected to the desired high-pass source (local feedback) and the input terminal of the filter is connected to the desired low-pass source (load feedback). For example, the filter capacitors of a Sallen and Key low-pass filter 62, such as shown in FIG. 2(b) (of any order), which are normally connected to ground can be connected to the local feedback source and the first input resistor can be connected to the load remote sensing source as shown in FIG. 3. Additional information regarding Sallen and Key filters can be found in "A Practical Method of Designing RC Active Filters" authored by R. P. Sallen and E. L. Key on pages 51–62 of the March 1955 issue of IRE Transaction Circuit Theory which is incorporated herein by reference. Clearly, filter 62 of FIG. 2(b), when configured in this manner, must be unity-sum whenever the output impedance of the chosen filter is low enough to be unaffected by the loading of the rest of the feedback circuit. Whenever an active embodiment is used, this condition is easily met. This condition may not always be met by passive filters 60 such as shown in FIG. 2(a).

State-variable filters, such as filter 66 shown in FIG. 2(d), may also be used as high-order filter 40. The non-inverting inputs to the operational amplifiers used as inverting integrators are analogous to the common input of a Sallen and Key filter 62. Additionally, multiple feedback filters, such as filter 64 shown in FIG. 2(c), may be used and connected as shown. It should be understood, however, that whatever filter is used, the DC low-pass response should not be inverted relative to the high-pass response. Without an added inverter, the two-pole multiple feedback filter would have an inappropriately inverted LP response. While passive filters as simple as RC ladder network 60 as shown in FIG. 2(a) may also be used, such filters do not offer good, flat passband shapes.

All of the filters 60, 62, 64, 66 described above are analog in nature. It should be obvious to one skilled in the art that similar responses may also be obtained by digital filters according to the teachings of the present invention.

While this invention has been described as having exemplary designs, the present invention may be further modified within the spirit and scope of this disclosure. This application is therefore intended to cover any variations, uses, or adaptations of the invention using its general principles. Further, this application is intended to cover such departures from the present disclosure as come within known or customary practice in the art to which this invention pertains.

What is claimed is:

1. A power converter including:
   an amplifier circuit having an input for receiving a source signal and an output for outputting an output signal to a load; and
   a constant-sum filter having a first input for receiving a high-pass feedback signal from the amplifier circuit, a second input for receiving a remote sensing low-pass feedback signal from the amplifier circuit, and an output coupled to the amplifier circuit input, the filter being at least a second order filter and combining the high-pass feedback signal with the low-pass feedback signal to output a feedback control signal to the amplifier circuit to regulate the output signal provided to the load.

2. The power converter of claim 1 wherein the constant-sum filter is a three-terminal low-pass filter.

3. The power converter of claim 2 wherein the constant-sum filter includes a common terminal coupled to the high-pass feedback signal.

4. The power converter of claim 3 wherein the constant-sum filter includes an input terminal coupled to the low-pass feedback signal, and an output terminal for outputting the feedback control signal.

5. The power converter of claim 1 wherein the constant-sum filter has a gain of one.

6. The power converter of claim 1 wherein the constant-sum filter is an active filter.

7. The power converter of claim 1 wherein the constant-sum filter is a Sallen and Key filter.

8. The power converter of claim 1 wherein the constant-sum filter is a multiple-feedback filter.

9. The power converter of claim 1 wherein the constant-sum filter is a state-variable filter.

10. The power converter of claim 1 wherein the amplifier circuit includes a PWM power stage and an output filter having an input connected to the PWM power stage and an output connected to the amplifier circuit output, the remote sensing low-pass feedback signal being sensed at the amplifier circuit output.

11. The power converter of claim 10 wherein the amplifier circuit includes a feedback filter coupled to the output filter input, the feedback filter outputting the high-pass feedback signal.

12. The power converter of claim 11 wherein the feedback filter includes attenuation poles substantially corresponding to ripple frequencies associated with the PWM power stage.

13. The power converter of claim 1 wherein the amplifier circuit is an opposed current amplifier.

14. A method of regulating a power converter output signal including the steps of:
    receiving a high-pass feedback signal from the power converter;
    receiving a low-pass feedback signal from the power converter;
    combining the high-pass feedback signal and the low-pass feedback signal using a constant-sum filter of at least second order; and
    providing a control feedback signal to the power converter to regulate the output signal.

15. The method of claim 14 wherein the constant-sum filter is a three-terminal low-pass filter including a common terminal coupled to the high-pass feedback signal, an input terminal coupled to the low-pass feedback signal, and an output terminal for outputting the feedback control signal.

16. The method of claim 14 further including the step of passing the sum of the feedback control signal and a source signal through a PWM power stage and an output filter having an input connected to the PWM power stage and an output for providing the output signal.

17. The method of claim 16 further including the step of receiving the low-pass feedback signal from the output filter output.

18. The method of claim 16 further including the step of filtering a signal at the output filter input to provide the high-pass feedback signal.

19. An amplifier system including;
    an amplifier having a high-pass feedback signal output and a low-pass feedback signal output; and
    a remote sensing circuit including a constant-sum filter of at least second order for combining the high-pass and low-pass feedback signals to provide a feedback control signal to the amplifier.

20. The system of claim 19 wherein the constant-sum filter is a three-terminal low-pass filter.

21. The system of claim 20 wherein the low-pass filter includes a common terminal coupled to the high-pass feedback signal output, an input terminal coupled to the low-pass feedback signal output, and an output terminal for outputting the feedback control signal.

22. The system of claim 19 wherein the constant-sum filter is a unity gain active filter.

23. The system of claim 19 wherein the constant-sum filter is one of a Sallen and Key filter, a multiple-feedback filter, and a state-variable filter.

24. The system of claim 19 wherein the amplifier includes a PWM power stage, and an output filter having an input connected to the PWM power stage and an output coupled to a load, the low-pass feedback signal being sensed at the output filter output.

25. The system of claim 24 wherein the amplifier includes a feedback filter coupled to the output filter input, the feedback filter outputting the high-pass feedback signal.

26. The system of claim 19 wherein the amplifier is an opposed current amplifier.

* * * * *